(12) United States Patent
Trautmann et al.

(10) Patent No.: US 8,405,190 B2
(45) Date of Patent: Mar. 26, 2013

(54) COMPONENT HAVING A SILICON CARBIDE COATED VIA

(75) Inventors: Achim Trautmann, Leonberg (DE); Thorsten Mueller, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/998,868

(22) PCT Filed: Oct. 20, 2009

(86) PCT No.: PCT/EP2009/063733
§ 371 (c)(1),
(2), (4) Date: Oct. 19, 2011

(87) PCT Pub. No.: WO2010/069642
PCT Pub. Date: Jun. 24, 2010

(65) Prior Publication Data
US 2012/0038049 A1    Feb. 16, 2012

(30) Foreign Application Priority Data
Dec. 16, 2008   (DE) .................. 10 2008 054 765

(51) Int. Cl.
*H01L 29/40*   (2006.01)
*H01L 23/053*  (2006.01)
*H01L 23/12*   (2006.01)
*H01L 23/48*   (2006.01)
*H01L 23/52*   (2006.01)

(52) U.S. Cl. . 257/621; 257/700; 257/774; 257/E21.577; 257/E21.597; 257/E23.011

(58) Field of Classification Search .................. 257/621, 257/700, 774, E21.577, E21.597, E23.011
See application file for complete search history.

(56) References Cited

U.S. PATENT DOCUMENTS

| | | | | |
|---|---|---|---|---|
| 7,338,896 | B2* | 3/2008 | Vanhaelemeersch et al. | 438/638 |
| 7,622,810 | B2* | 11/2009 | Takao | 257/774 |
| 7,759,700 | B2* | 7/2010 | Ueno et al. | 257/192 |
| 7,772,123 | B2* | 8/2010 | Birner et al. | 438/700 |
| 7,821,105 | B2* | 10/2010 | Morimoto | 257/621 |
| 7,851,880 | B2* | 12/2010 | Suzuki et al. | 257/448 |
| 7,855,438 | B2* | 12/2010 | Barth | 257/623 |
| 7,880,307 | B2* | 2/2011 | Farnworth et al. | 257/774 |
| 7,989,345 | B2* | 8/2011 | Akram et al. | 438/667 |
| 8,003,525 | B2* | 8/2011 | Okamoto | 438/648 |
| 8,148,263 | B2* | 4/2012 | Sinha | 438/667 |
| 8,158,514 | B2* | 4/2012 | Kruger et al. | 438/667 |
| 8,319,347 | B2* | 11/2012 | Tsai et al. | 257/774 |
| 2005/0059217 | A1 | 3/2005 | Morrow et al. | |
| 2005/0118482 | A1* | 6/2005 | Sriramulu et al. | 429/34 |
| 2007/0045780 | A1 | 3/2007 | Akram et al. | |

(Continued)

FOREIGN PATENT DOCUMENTS

| | | |
|---|---|---|
| DE | 102 44 077 | 3/2004 |
| DE | 10 2006 060 205 | 4/2008 |

(Continued)

*Primary Examiner* — Ida M Soward
(74) *Attorney, Agent, or Firm* — Kenyon & Kenyon LLP

(57) ABSTRACT

A component including a via for electrical connection between a first and a second plane of a substrate is provided. The substrate has a borehole having an inner wall that is coated with a conductive layer made of an electrically conductive material, an intermediate layer being disposed between the inner wall and the conductive layer. The intermediate layer includes electrically insulating SiC.

7 Claims, 2 Drawing Sheets

U.S. PATENT DOCUMENTS

2007/0148970 A1\* 6/2007 Lin et al. ............... 438/678
2007/0181993 A1\* 8/2007 Choi et al. .............. 257/698
2008/0164574 A1\* 7/2008 Savastiouk et al. ...... 257/621
2008/0286899 A1 11/2008 Jung
2010/0032764 A1\* 2/2010 Andry et al. ............ 257/369

FOREIGN PATENT DOCUMENTS

EP 1 187 192 3/2002

\* cited by examiner

COMPONENT HAVING A SILICON CARBIDE COATED VIA

BACKGROUND OF THE INVENTION

1. Field of the Invention

The present invention relates to a component having a via for electrical connection between a first and a second plane of a substrate.

2. Description of Related Art

Components having a via are known from the existing art. Published European patent document EP 1 187 192 A2, for example, describes a method for producing an electrically conductive connection through one or more insulating layers, an electrical current flow between two electrically conductive points that are located in different structural planes being made possible by way of a contact hole filled with a conductive material.

It is further known, in the context of a via, to dispose an insulating layer between a substrate and an electrically conductive material. According to the teaching of published German patent document DE 102 44 077 B4, in the method for manufacturing a semiconductor component a hole is formed through a substrate, the hole then being lined with an insulating layer. Lastly, an electrical connection through the hole is produced by filling the hole in electrodeposition fashion with a metallic material. The insulating layer has the purpose of electrically separating the substrate from the metallic filling of the hole, and preventing diffusion of metal ions into the substrate. It is proposed to provide an insulating layer made of silicon oxide or of silicon oxide and silicon nitride. The materials copper, nickel, or a nickel-iron alloy are recited as a metallic filling.

Similarly, a method with which vias can be produced by electrodeposition of a metal is known from published German patent application document DE 10 2006 060 205 B3. According to the teaching, for this purpose firstly a wafer is equipped with orifices, a diffusion barrier that completely lines the orifices being disposed in the inner region of the orifices. The diffusion barrier serves to prevent diffusion of the metal (to be deposited later) of the via into the semiconductor material of the wafer. While the diffusion barrier can be constituted from tantalum nitride, filling of the orifices is accomplished by electrodeposition of copper.

An insulating or barrier layer in the context of a via is subject to certain requirements, as many of which, as possible must be met simultaneously: the layer should have an electrically insulating property that is sufficiently pronounced to reliably prevent the flow of electricity through the layer. In addition, the layer must have a low diffusion constant in order likewise to reliably prevent material flow through the layer. Lastly, for an industrial application it is important to ensure that the layer can be manufactured in controlled and reliable fashion, and can be integrated easily and without much complexity into an existing manufacturing method for the component.

BRIEF SUMMARY OF THE INVENTION

The component according to the present invention having a via, and the method for manufacturing it, have the advantage as compared with the existing art that an intermediate layer which optimally meets all the aforesaid requirements is made available for the via. The invention thereby offers the possibility of making available a component having a via in which no compromise must be made among the various requirements for the intermediate layer.

This advantage is achieved by way of a specific material selection for the layer between a substrate and an electrically conductive material.

It is further advantageous that the material selection according to the present invention in fact makes it possible also to provide, in only one layer formation process, not only the intermediate layer but also a conductive layer for the via.

DETAILED DESCRIPTION OF THE INVENTION

Figure 1:
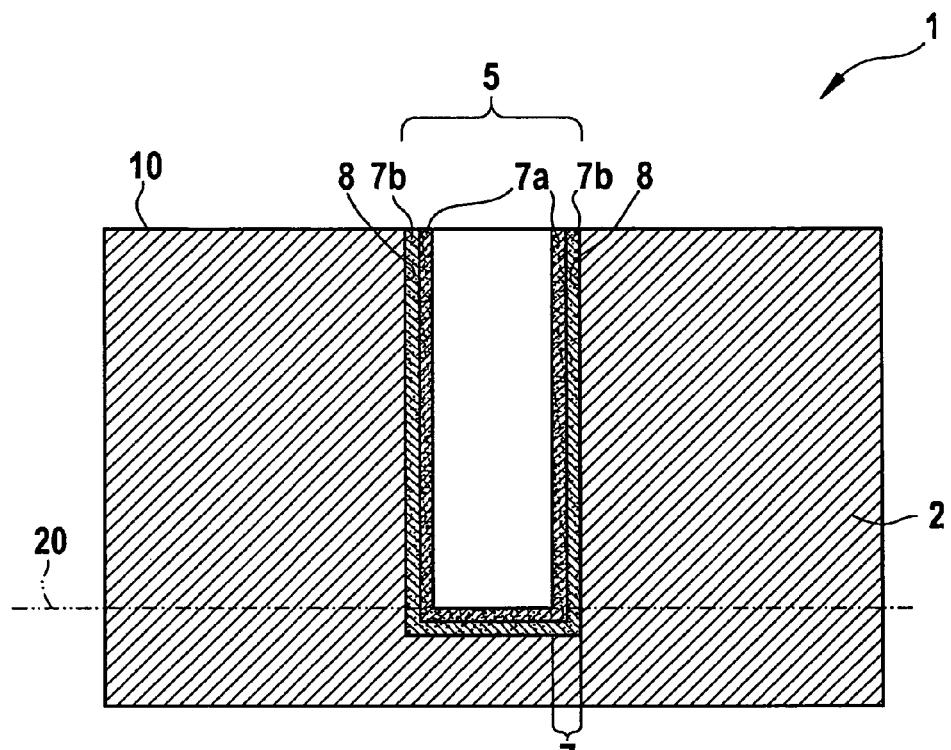
FIG. 1 shows a component having a borehole in the form of a blind hole (bottom of the borehole is not open).
Figure 2:
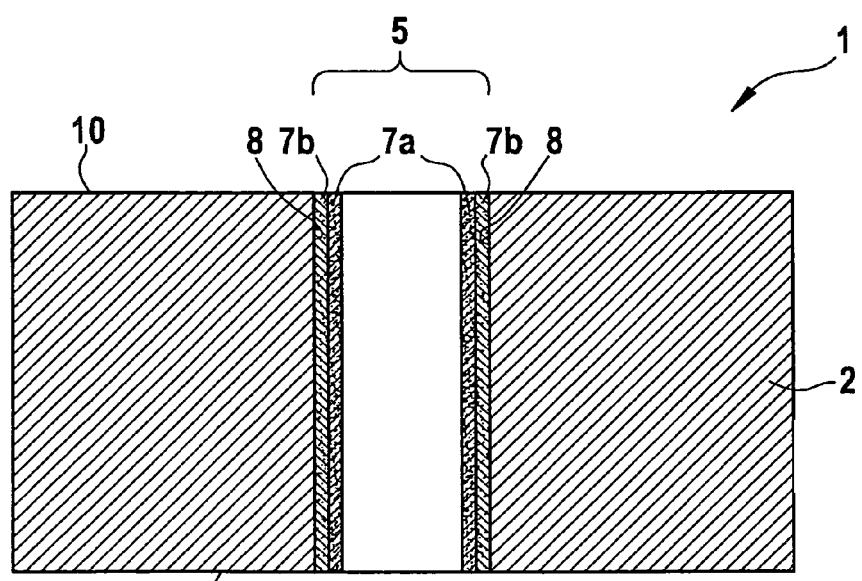
FIG. 2 shows a component having a borehole in the form of a through hole (bottom of the borehole is open).
Figure 3:
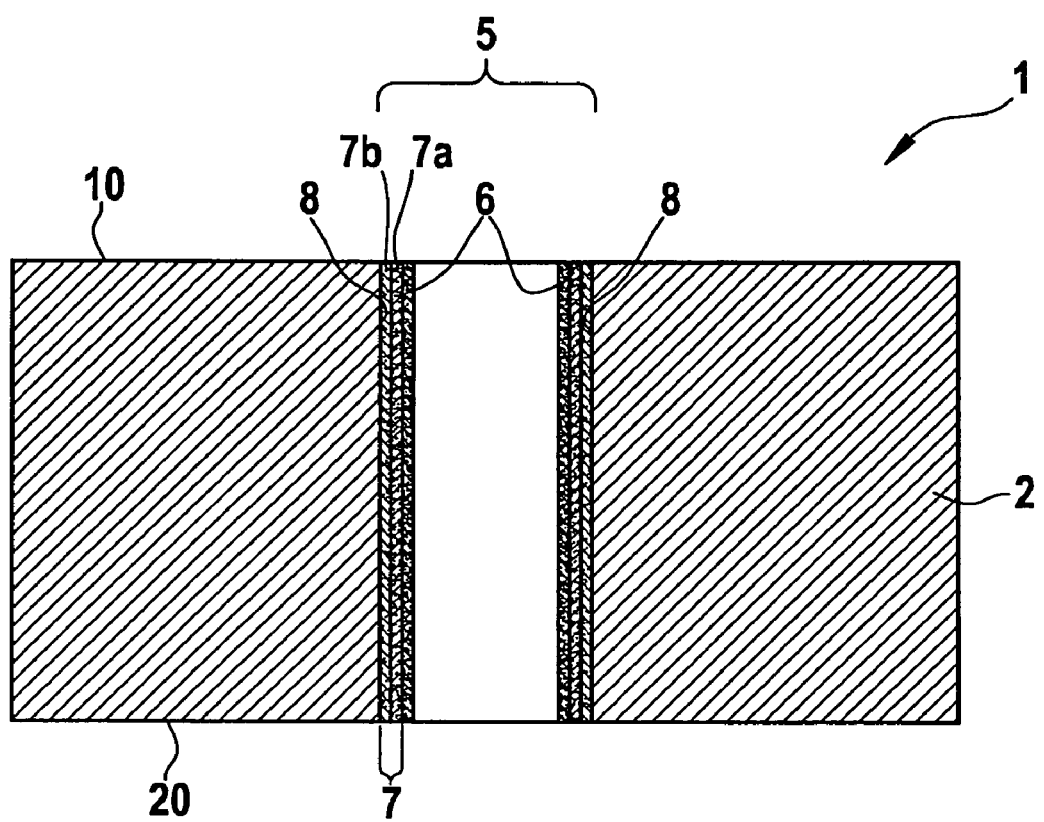
FIG. 3 shows an exemplifying embodiment of the component according to the present invention having a via.

The method according to the present invention for manufacturing a component 1 having a via for electrical connection between a first 10 and a second plane 20 of a substrate 2, and component 1 according to the present invention in its many embodiments thereby manufactured, are described in further detail with the aid of FIGS. 1, 2, and 3. To avoid repetition, all features that are presented as a method feature are also to be regarded as disclosed as a structural feature to the extent that is appropriate, and vice versa.

The method according to the present invention encompasses fundamentally the following steps that are carried out in succession:

a) making available a substrate 2;
b) forming a borehole 5, having an inner wall 8, between a first 10 and a second plane 20 of substrate 2;
c) depositing an intermediate layer 7 onto inner wall 8, such that intermediate layer 7 encompasses electrically insulating SiC; and
d) depositing a conductive layer 6, made of an electrically conductive material, onto intermediate layer 7, so that an electrical connection is formed between first 10 and second plane 20 of substrate 2.

The invention is based on the recognition that silicon carbide represents an extremely suitable material for an intermediate layer 7 between inner wall 8 of borehole 5 and conductive layer 6. Firstly, SiC, because of its wide bandgap, is notable for low electrical conductivity and a high dielectric strength. In addition, the material has a low diffusion constant because of its high packing density. The material furthermore has excellent thermal conductivity.

In step a) a substrate 2 that is to be provided with a via is made available. A semiconductor material, in particular a silicon substrate, is preferably favored as substrate 2.

In step b), borehole 5 can be formed using a deep reactive ion etching (DRIE) process, or with a laser drilling method, as necessary. In any event, step b) generates a borehole 5 having an inner wall 8, borehole 5 being disposed between a first 10 and a second plane 20 of substrate 2. As depicted in FIG. 1, a borehole 5 in the form of a blind hole can be produced, i.e. the bottom of borehole 5 is not open. This blind hole can, however be opened as necessary after the deposition of intermediate layer 7, i.e. after step c). The opening of the bottom converts the state according to FIG. 1 into a state according to FIG. 2. A borehole in the form of a through hole can, however, also be produced directly in step b).

In step c), silicon carbide is deposited according to the present invention for intermediate layer 7. A controlled, reliable SiC deposition process is ensured by the use of presentday technology. It is proposed that SiC preferably be deposited by way of a chemical vapor deposition (CVD) process, or a epitaxy process.

Provision can be made that in step c), intermediate layer 7 advantageously encompasses a barrier layer 7a and/or an insulating layer 7b. For the case in which intermediate layer 7 is deposited with a barrier layer 7a and an insulating layer 7b as sub-layers, barrier layer 7a directly adjoins conductive layer 6. A suitable layer sequence is therefore formed on inner wall 8 of borehole 5: inner wall 8/insulating layer 7b/barrier layer 7a/conductive layer 6. It is possible here for insulating layer 7b to be made, as is known in the existing art, from an oxide, in particular silicon oxide, or a nitride, in particular silicon nitride, although barrier layer 7a is now, in a departure from the existing art, made from silicon carbide.

A particularly advantageous embodiment provides that in step c), intermediate layer 7 is deposited with a barrier layer 7a and an insulating layer 7b as sub-layers, both sub-layers now being formed from an electrically insulating SiC. Intermediate layer 7 made of SiC thus serves as an insulating layer 7b and as a barrier layer 7a.

With respect to conductive layer 6, be it noted that in step d) this conductive layer 6 can be deposited from a metallic material, in particular Cu, Au, or Al.

A particularly preferred embodiment, however, consists in the fact that in step d), conductive layer 6 is also deposited from SiC, specifically a doped, electrically conductive SiC. To obtain an electrically conductive SiC, sufficiently high doping of the material is deliberately produced. Because the doping intensity can be varied in defined fashion in the context of production of an SiC layer, provision is preferably made that deposition of an intermediate layer 7 according to step c), and deposition of a conductive layer 6 according to step d), be performed in one SiC deposition process, with the doping intensity increasing during the deposition process. In situ variation of doping intensity during a deposition process significantly simplifies the entire method. Be it noted also that subsequent back-polishing or back-etching of substrate 2 is necessary if a blind hole was produced in step b) and if conductive layer 6 needs to be exposed.

A component 1 that is manufactured using such a method is shown in FIG. 3. Borehole 5 is coated on inner wall 8 with a SiC material, and the doping of the SiC material increases from inner wall 8 toward the center of the borehole. Multiple layer planes differing in electrical conductivity are thus created within the SiC material: insulating layer 7b, barrier layer 7a, and electrically conductive layer 6. Intermediate layer 7 is low-doped or compensation-doped, while conductive layer 6 is highly doped.

After step d), electrodeposited or chemical reinforcement of conductive layer 6 can also be performed.

Be it noted furthermore that in all the FIGS. 1 to 3, the transition between the individual layers, namely between insulating layer 7b, barrier layer 7a, and electrically conductive layer 6, has been depicted as being sharp and abrupt. If necessary, however, individual or even all transitions between the aforesaid layers can occur smoothly, for example in the case of an intermediate layer 7 and a conductive layer 6 made of an SiC material, if the doping intensity is varied not abruptly but instead gradually. A graphic depiction of these smooth transitions between the layers has been omitted for reasons of clarity.

Component 1 can moreover be a microelectronic or microelectromechanical component 1.

What is claimed is:

1. A component having a via for electrical connection, comprising:
a substrate having a borehole defined between a first plane and a second plane of the substrate;
wherein the borehole has an inner wall coated with an intermediate layer, and wherein the intermediate layer is coated with a conductive layer made of an electrically conductive material, whereby the intermediate layer is disposed between the inner wall and the conductive layer, and wherein the intermediate layer includes electrically insulating SiC,
wherein the intermediate layer includes at least one of a barrier layer and an insulating layer,
wherein the intermediate layer includes the barrier layer and the insulating layer as sub-layers, and wherein the barrier layer directly adjoins the conductive layer,
wherein the barrier layer is formed from electrically insulating SiC, and wherein the insulating layer includes one of an oxide or a nitride.

2. The component as recited in claim 1, wherein the conductive layer is made of a metallic material including one of Cu, Au, or Al.

3. A component having a via for electrical connection, comprising:
a substrate having a borehole defined between a first plane and a second plane of the substrate;
wherein the borehole has an inner wall coated with an intermediate layer, and wherein the intermediate layer is coated with a conductive layer made of an electrically conductive material, whereby the intermediate layer is disposed between the inner wall and the conductive layer, and wherein the intermediate layer includes electrically insulating SiC,
wherein the intermediate layer includes at least one of a barrier layer and an insulating layer,
wherein the intermediate layer includes the barrier layer and the insulating layer as sub-layers, and wherein the barrier layer directly adjoins the conductive layer,
wherein the barrier layer and the insulating layer are formed from electrically insulating SiC.

4. A component having a via for electrical connection, comprising:
a substrate having a borehole defined between a first plane and a second plane of the substrate;
wherein the borehole has an inner wall coated with an intermediate layer, and wherein the intermediate layer is coated with a conductive layer made of an electrically conductive material, whereby the intermediate layer is disposed between the inner wall and the conductive layer, and wherein the intermediate layer includes electrically insulating SiC,
wherein the intermediate layer includes at least one of a barrier layer and an insulating layer,
wherein the conductive layer is formed from a doped, electrically conductive SiC.

5. The component as recited in claim 4, wherein the intermediate layer includes the barrier layer and the insulating layer as sub-layers, and wherein the barrier layer directly adjoins the conductive layer.

6. The component as recited in claim 4, wherein the intermediate layer and the conductive layer are formed from one common SiC layer, and wherein the transition from the insulating intermediate layer to a conductive layer is achieved within the one common SiC layer by increasing doping from the intermediate layer to the conductive layer.

7. The component as recited in claim 6, wherein the substrate is formed from silicon.

* * * * *